United States Patent [19]

Walker et al.

[11] Patent Number: 5,579,348
[45] Date of Patent: Nov. 26, 1996

[54] METHOD AND APPARATUS FOR IMPROVING THE APPARENT ACCURACY OF A DATA RECEIVER CLOCK CIRCUIT

[75] Inventors: G. Kent Walker, Escondido; Paul Moroney, Olivenhain, both of Calif.

[73] Assignee: GI Corporation, Hatboro, Pa.

[21] Appl. No.: 191,028

[22] Filed: Feb. 2, 1994

[51] Int. Cl.⁶ ............................. H04L 7/00; H03D 3/24
[52] U.S. Cl. ........................................ 375/355; 375/376
[58] Field of Search ..................... 375/119, 355, 375/371, 373, 376, 375, 362; 348/512, 536, 537, 540; 327/154, 156, 162, 163

[56] References Cited

U.S. PATENT DOCUMENTS

| | | | |
|---|---|---|---|
| 3,806,822 | 4/1974 | Meyer et al. | 375/376 |
| 3,819,853 | 6/1974 | Stein | 375/371 |
| 4,017,803 | 4/1977 | Baker | 375/376 |
| 4,077,016 | 2/1978 | Sanders et al. | 331/4 |
| 4,633,193 | 12/1986 | Scordo | 331/1 A |
| 4,642,573 | 2/1987 | Noda et al. | 375/88 |
| 4,893,319 | 1/1990 | Ziuchkovski | 375/376 |
| 5,184,091 | 2/1993 | Srivastava | 331/10 |
| 5,231,486 | 7/1993 | Acampora et al. | 358/133 |
| 5,241,382 | 8/1993 | Paike | 358/135 |
| 5,276,716 | 1/1994 | Wincn | 375/376 |

FOREIGN PATENT DOCUMENTS 0335509  10/1989  European Pat. Off. .......... H04L 7/02

*Primary Examiner*—Edward L. Coles, Sr.
*Assistant Examiner*—Jerome Grant, II
*Attorney, Agent, or Firm*—Barry R. Lipsitz; Ralph F. Hoppin

[57] ABSTRACT

The apparent accuracy of a clock circuit used to recover timing and transmitted information signals in a data receiver is improved. A timing relationship inherent in a received signal is detected prior to the acquisition of a timing component embedded in a desired information portion of the received signal. The timing relationship has an accuracy that is greater than the accuracy of the clock circuit. The clock circuit is controlled in response to the timing relationship to operate with an improved range of accuracy. Thereafter, the embedded timing component is acquired and used to control the clock circuit. In an illustrated embodiment, the timing relationship is derived from a symbol rate of the received signal. In an alternate embodiment, the timing relationship is obtained from a separate transmitted reference signal, such as a transmitted television signal.

21 Claims, 2 Drawing Sheets

METHOD AND APPARATUS FOR IMPROVING THE APPARENT ACCURACY OF A DATA RECEIVER CLOCK CIRCUIT

BACKGROUND OF THE INVENTION

The present invention relates to the communication of digital data, and more particularly to a method and apparatus for improving the apparent accuracy of a relatively inaccurate clock circuit used in a data receiver based on timing information contained in a received signal.

In digital communications, it is frequently necessary to extract a coherent clock signal from an input data stream. A phase lock loop (PLL) is often used for this task by locking a voltage controlled oscillator (VCO) to the input data. The output of the VCO is then used as a clock to extract the data bits from the input signal.

In a PLL, feedback is used to maintain an output signal in a specific phase relationship with a reference input signal. In clock recovery circuits, the output signal is derived from an adjustable master oscillator. Typically, it is required to provide a high precision adjustable master oscillator (i.e., clock) in order to quickly acquire a timing component (timebase) necessary to receive and recover a desired signal. The timing component may be embedded in data packets containing the specific information that is desired to be received.

In systems in which video, audio or other data transport services are provided asynchronously with respect to the data transfer rate of the communication system, it is necessary to synchronize the local output clock (i.e., the receiver master clock) to timing information embedded in the incoming packet data. Often, the nominal timebase frequency of the packet services are very close to a known frequency, such as on the order of a few parts per million (ppm), but are still not synchronous. In order to synchronize the local output clock to the timing information embedded in the incoming packet data, a packet time reference tracking loop (i e., "output timing loop") is used to control the master clock based on the difference between the master clock frequency and the phase and timing information present in the received packets.

It is typical for the bandwidth of the output timing loop to be quite narrow, for example on the order of much less than one Hz. As a result of this low loop bandwidth, the local output oscillator can require a significant amount of time to acquire a desired signal. An approach to ameliorating this problem, as indicated above, has been to maintain a high precision local master clock frequency. For example, master clocks having an accuracy on the order of a few ppm are appropriate. The requirement for an accurate master clock introduces complexity and significant cost into data receiver systems.

It would be advantageous to provide a data receiver that can quickly acquire a desired timing signal using a low cost local master clock. It would be further advantageous to provide such a system that increases the apparent accuracy of a less accurate clock in order to reduce the amount of time necessary to acquire a desired signal.

The present invention provides a method and apparatus enjoying the aforementioned advantages for improving the apparent accuracy of a clock circuit used to recover transmitted information signals in a data receiver.

SUMMARY OF THE INVENTION

In accordance with the present invention, a method is provided for improving the apparent accuracy of a clock circuit used to recover timing and transmitted information signals in a data receiver. A known timing relationship inherent in a received signal (hereinafter the "timing relationship") is detected prior to the acquisition of the service timing component embedded in an information portion of the received signal (hereinafter the "timing component"). The timing relationship has an accuracy that is greater than the accuracy of the local clock circuit. The clock circuit is controlled in response to the timing relationship to operate with an improved range of frequency accuracy.

After the clock circuit is operating with the improved range of accuracy, the timing component of the information portion of the received signal is acquired. The clock circuit is then controlled in response to the timing component instead of in response to the timing relationship. In an illustrated embodiment, the timing relationship is derived from a symbol rate of the received signal. Generally, the timing relationship and the timing component will be asynchronous. The timing component may be embedded in data packets for a desired service carried within the received signal.

In a first embodiment in which the timing relationship is derived from a symbol rate of the received signal, the symbol rate is defined by a stream of received symbols. The clock circuit is controlled in response to the timing relationship by comparing a phase of the stream of received symbols to a phase of a clock signal produced by the clock circuit. In a different embodiment where the timing relationship is derived from a symbol rate of the received signal, a time interval is established by counting a set of the received symbols. The total number of pulses generated by the clock circuit over the time interval is then determined. The clock circuit is controlled in response to the timing relationship by comparing the total number of pulses to a predetermined reference value to provide a clock circuit control signal.

The present invention also provides apparatus for improving the apparent accuracy of a clock circuit. The clock circuit is used to recover timing and transmitted information signals in a data receiver. Means such as a symbol timing loop, are provided for detecting a timing relationship inherent in a received signal prior to the acquisition of a timing component embedded in an information portion of the received signal. The timing relationship has an accuracy that is greater than the accuracy of the local clock circuit. First means, such as a calibration loop, are provided for controlling the clock circuit in response to the timing relationship to operate within an improved range of accuracy.

Means, such as an embedded timing detector, are further provided for acquiring the timing component after the clock circuit is operating with the improved range of accuracy. Second means, such as a packet timing recovery loop comprising a counter, loop filter, D/A converter and comparator, control the clock circuit in response to the timing component instead of in response to the timing relationship after the timing component has been acquired.

The timing relationship can be derived from a symbol rate of the received information signal. The symbol rate is defined by a stream of received symbols. The first means, such as a calibration loop, for controlling the clock circuit can compare a phase of the stream of received symbols to a phase of a clock signal produced by the clock circuit. In an alternate embodiment, means, such as a signal timing loop are provided for establishing a time interval by counting a set of the received symbols. A determination is made as to the total number of pulses generated by the clock circuit over the time interval. The first means, such as a calibration loop, then controls the clock circuit by comparing the total number of pulses to a reference value to provide a clock circuit control signal. The timing component can be embedded in data packets for a desired service carried within the received signal.

In another embodiment, apparatus is provided for improving the apparent accuracy of a clock circuit used to recover timing and transmitted information signals in a data receiver. Means, such as a symbol timing loop, are provided for detecting a timing relationship in a first received signal prior to the acquisition of a timing component embedded in an information portion of a second received signal. The timing relationship has an accuracy that is greater than the accuracy of the clock circuit. First means, such as a symbol timing loop, are provided to control the clock circuit in response to the timing relationship to operate within an improved range of accuracy. Means, such as a calibration loop, are also provided for acquiring the timing component after the clock circuit is operating with the improved range of accuracy. Second means, such as an embedded timing detector, control the clock circuit in response to the timing component instead of in response to the timing relationship after the timing component has been acquired. In one embodiment, the first received signal is a transmitted television signal and the timing relationship is an inherent timing relationship thereof. For example, the timing relationship could be derived from synchronization or color burst pulses of the television signal.

DETAILED DESCRIPTION OF THE INVENTION

The present invention reduces the acquisition time of a digital signal by locking the output of the master clock in a receiver to a data rate of the transmission channel that is more accurate than the master clock itself. The resultant master clock frequency is utilized for the initial local clock once data acquisition is achieved. Subsequently, the master clock output rate control is transferred to a timing component embedded in the received signals. For example, the output rate control can be achieved using conventional data packet timing information after the accuracy of the master clock has been improved by locking the master clock to the data symbol rate.

In an alternative implementation, an incoming synchronous data tick is measured and used to adjust the local reference clock prior to data carrier acquisition. For example, an accurate periodic frame sync pulse can be detected in the incoming data and used to lock the output of the master clock. In another embodiment, a transmitted reference signal is retrieved for use in controlling the master clock to operate with an improved range of accuracy. The transmitted reference signal can comprise, for example, an inherent component of a broadcast television signal, such as a horizontal sync or color burst pulse.

The invention enables a relatively inaccurate and inexpensive oscillator, such as a voltage controlled oscillator or voltage controlled crystal oscillator, to be used for output master timing at a receiver without unduly increasing acquisition time. The initial output timing of the local clock will be as accurate as the timing relationship (e.g., symbol rate) derived from the received signal.

Figure 1:
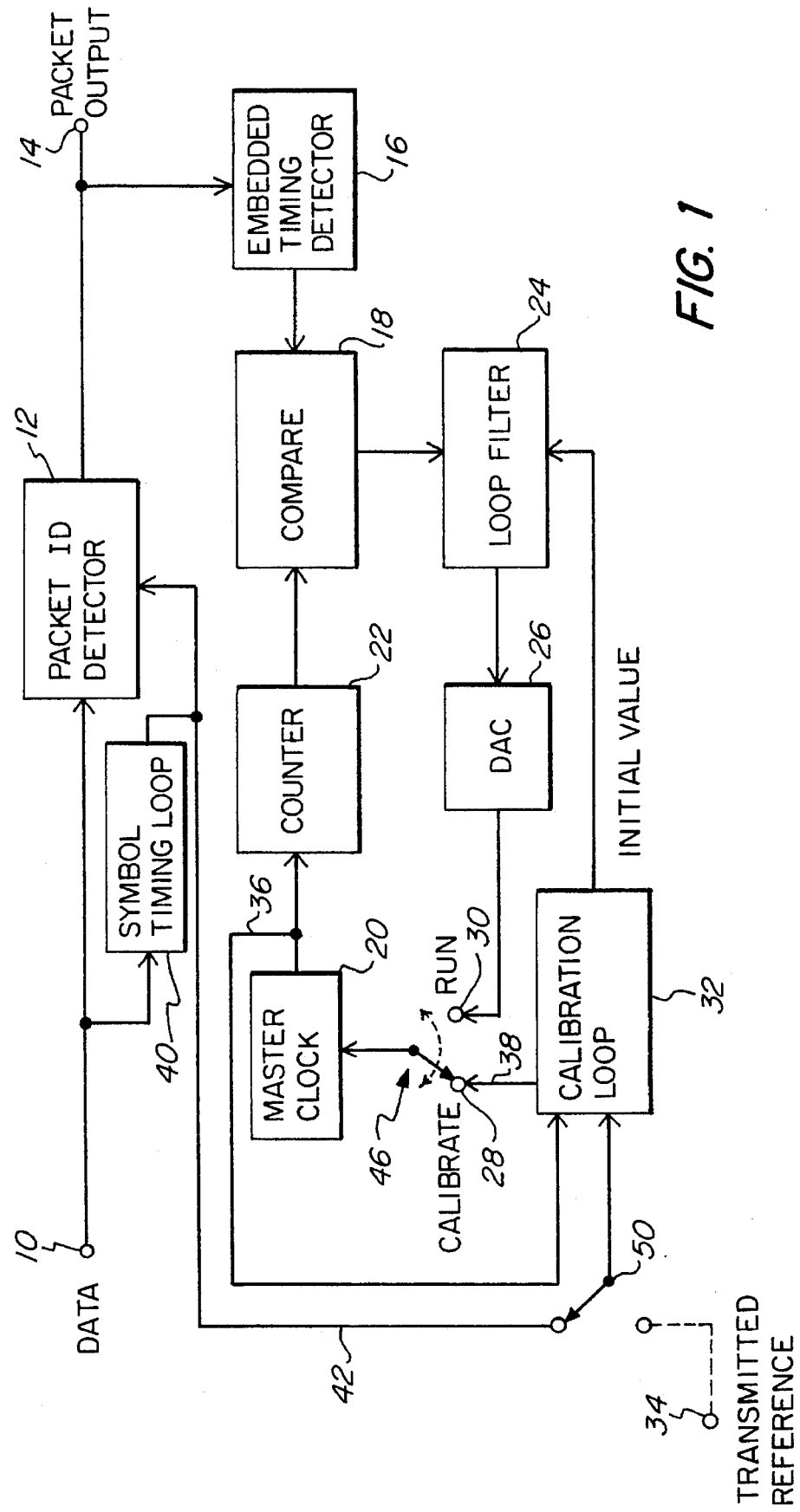
FIG. 1 is a block diagram of a clock recovery circuit in accordance with the present invention illustrating both calibration and run modes of the master clock.

A block diagram of a system in accordance with the present invention is provided in FIG. 1. A received data signal is input to a packet identification detector 12 and a symbol timing loop 40 via an input terminal 10. Packet ID detector 12 is a conventional component, which detects the packets for a desired service from a multiplex of packets contained in the received signal. The packets for the desired service are output via a terminal 14. An example of a data packet communication scheme can be found in Paik, et al., U.S. Pat. No. 5,241,382 which issued on Aug. 31, 1993 for "Digital HDTV Data Packet Format and Receiver Therefor." Another example can be found in ISO/IEC 13818-1:CD, "MPEG-2 Systems Committee Draft Standard," Nov. 29, 1993.

The signal received at terminal 10 is in the form of data symbols having a fixed data rate. Symbol timing loop 40 detects the symbol rate and provides it as a timing reference to packet ID detector 12. In accordance with the present invention, the symbol rate is also coupled to a calibration loop 32 at terminal 50 via line 42 and switch 44. The calibration loop uses the symbol rate as a timing relationship to control master clock 20 to operate with an improved range of accuracy, prior to acquiring a timing component embedded in an information portion of the signal received at terminal 10. During calibration, the master clock 20 receives a calibration signal via line 38 from the calibration loop and terminal 28 of switch 46. The output of master clock 20 is fed back to the calibration loop via line 36. This feedback enables the calibration loop to bring the master clock frequency into a narrow range dictated by the more accurate data symbol rate determined from the received signal by symbol timing loop 40.

After the calibration loop has brought the master clock to an improved range of accuracy, the calibration signal used to control the master clock is output as an initial value to a loop filter 24 of a packet timing loop. The initial value is used by the packet timing loop as an initial condition to acquire a packet timing reference from the received packets.

The packet timing recovery loop is a conventional circuit that comprises a counter 22, loop filter 24, and a digital-to-analog converter (DAC) 26. After calibration has been achieved, switch 46 is actuated to couple the master clock control input to a "run" mode of operation via switch terminal 30. At this point, instead of being controlled by the calibration signal output from calibration loop 32, the master clock is controlled by the analog output of DAC 26.

Comparator 18 of the packet timing recovery loop compares the result of counting the actual master clock frequency at counter 22, to a timing component detected by embedded timing detector 16. The timing component is embedded in the packets output from the packet ID detector 12. If the master clock is not at the exact frequency dictated by the embedded timing component, the output of comparator 18 will be indicative of this difference. The difference is processed by loop filter 24 in a conventional manner, and converted to an analog format by DAC 26 for bringing master clock 20 to the frequency dictated by the embedded timing.

In an alternative embodiment, a transmitted reference can be used by the calibration loop instead of a timing relationship (e.g., symbol rate) inherent in the signal received at terminal 10. In order to accomplish this, switch 44 is actuated to receive a transmitted reference signal from terminal 34 instead of receiving the symbol timing via line 42. The transmitted reference can be any accurate reference signal. For example, the transmitted reference can be derived from a timing relationship such as horizontal sync or color burst pulses provided in a broadcast television signal. Any such timing reference with a suitable accuracy that is more accurate than the local master clock 20 can be used. It is noted that switch 44 and terminal 34 are optional, and will only be provided if it is desired to choose between a timing relationship inherent in the signal received at terminal 10 and a separate transmitted reference. Where only a separate transmitted reference is to be used, switch 44 and line 42 can be eliminated, with terminal 34 being coupled directly to terminal 50 of calibration loop 32.

Figure 2:
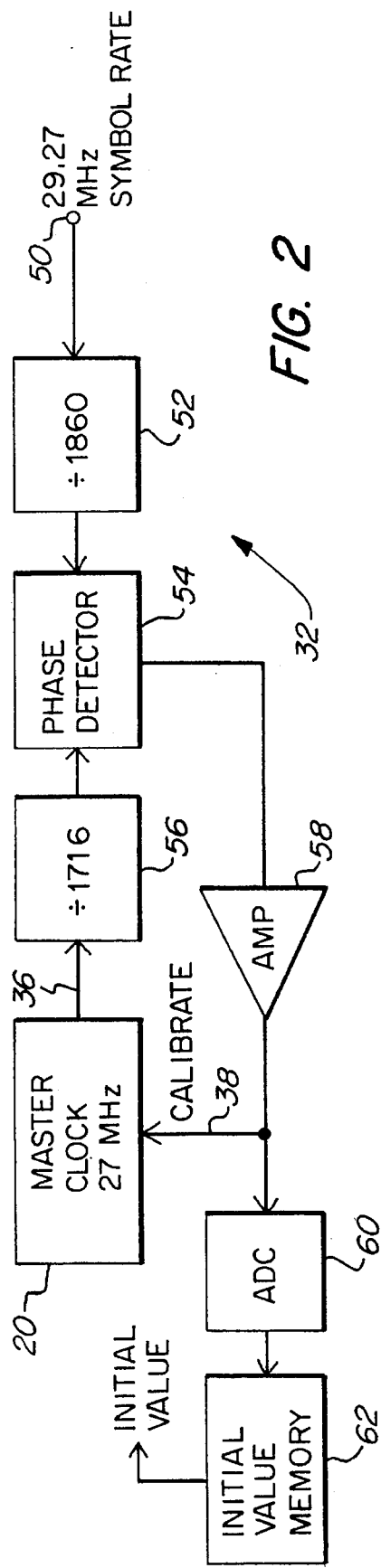
FIG. 2 is a block diagram of one embodiment of the calibration loop of FIG. 1.
Figure 3:
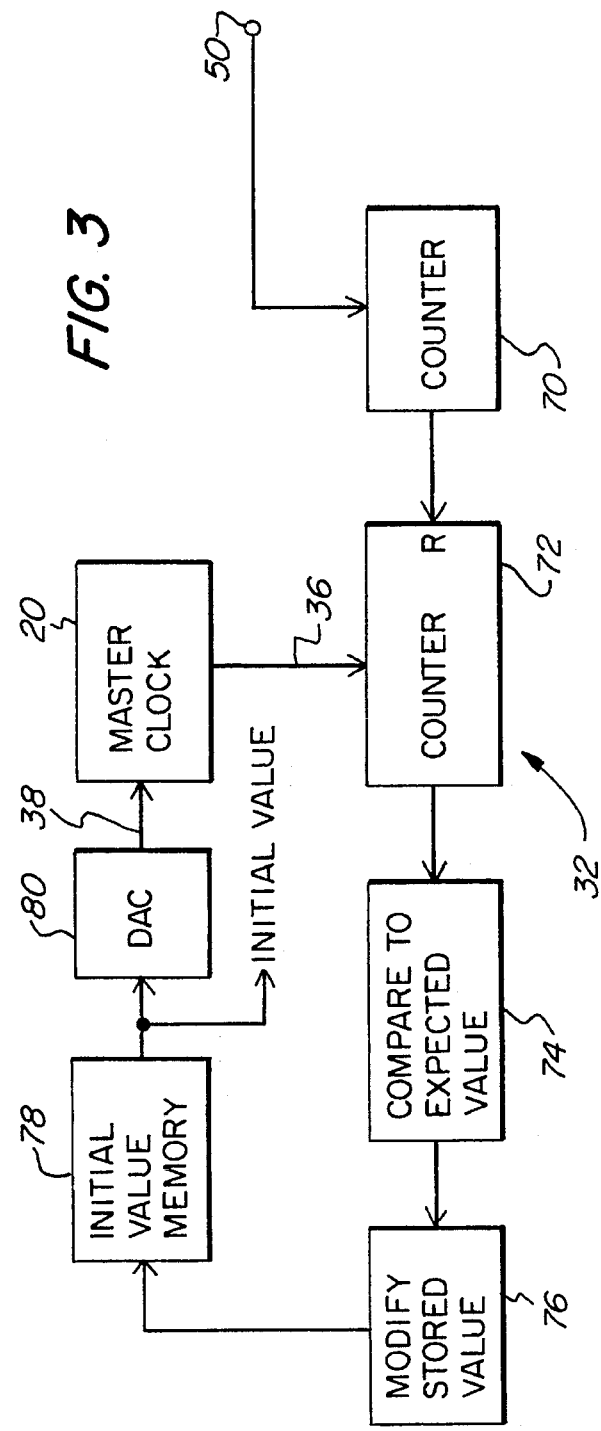
FIG. 3 is a block diagram of another embodiment of the calibration loop of FIG. 1.

Two different embodiments implementing a calibration loop 32 are disclosed in FIGS. 2 and 3. In FIG. 2, a phase lock loop is used to bring the master clock 20 to the same accuracy as the symbol rate. In the illustrated embodiment, the master clock runs at a nominal frequency of 27 MHz. The symbol rate detected by symbol timing loop 40 (FIG. 1) and input to the calibration loop via terminal 50 is 29.27 MHz. The symbol rate is divided by divider 52 (÷1860) and input to a phase detector 54. The master clock output is input via line 36 to a divider 56 (÷1716) for input to phase detector 54. These specific numbers were selected to correspond to the horizontal frequency rate of a standard National Television System Committee (NTSC) television signal. Where the present invention is used in connection with the reception of digital video signals, the dividing of the symbol rate and master clock rate down to the NTSC line rate enables video circuitry already present in the receiver to be shared with the calibration loop. It should be appreciated, however, that any other desired relationship can be used and the specific symbol rate, clock rate and divide rates shown are for purposes of illustration only.

Phase detector 54 will determine any difference between the divided down master clock frequency and the divided down symbol rate, and provide an error signal for controlling the master clock in a conventional manner. An amplifier 58 is provided to amplify the error signal as well known in the art. An analog-to-digital converter (ADC) 60 converts the analog error signal to a digital value for storage in initial value memory 62. As noted above, when the master clock has been brought into a more accurate range by the calibration loop 32, the initial value is used as the starting reference by loop filter 24 in the packet timing loop of FIG. 1.

In the calibration loop embodiment illustrated in FIG. 3, the symbol rate output by symbol timing loop 40 (FIG. 1) is input to a counter 70 via terminal 50. Counter 70 counts a fixed number of received symbols to establish a fixed time increment that is directly related to the master time base used at the data encoder which packetized the data prior to transmission. At the same time counter 70 is counting received symbols, a counter 72 counts the pulses from master clock 20. After each fixed time interval determined by counter 70, counter 72 is reset. The number of pulses counted by counter 72 during the fixed time interval is compared to an expected value at comparator 74 to determine any difference between the number of pulses expected from master clock 20 over the fixed time interval and the actual number of pulses produced by the clock over this interval. The error signal is used to modify a stored nominal value for controlling master clock 20, using logic 76 (e.g., a read-modify-write function). The modified value is stored in initial value memory 78 and converted to an analog form by DAC 80 for controlling master clock 20. Once the master clock has been calibrated by the calibration loop, the then current initial value is output from initial value memory to loop filter 24 of the packet timing loop, as illustrated in FIG. 1. Those skilled in the art will appreciate that the calibration loop embodiment of FIG. 3 is a so-called "frequency lock loop", as opposed to the phase lock loop embodiment illustrated in FIG. 2.

The actuation of switch 46 (FIG. 1) from the calibrate position to the run position can be responsive to any desired threshold. For example, in the phase lock loop embodiment of FIG. 2, a fixed time-out can be provided whereby switch 46 is switched to the run position after a predetermined time period that is suitable under worst case conditions to bring the master clock into a desired range of accuracy. Alternatively, the switch can be actuated after detecting a lock condition of the phase lock loop. In the frequency lock loop embodiment of FIG. 3, switch 46 can be actuated from the calibrate position to the run position after a predetermined number of symbols have been counted by counter 70. For example, to obtain a one ppm resolution, counter 70 would have to count one million symbols. At a symbol rate of 30 MHz, this would require about 33 milliseconds. When the desired accuracy is achieved, switch 46 is placed into the run mode for acquisition and tracking of the embedded packet timing.

It should now be appreciated that the present invention provides a method and apparatus for improving the apparent accuracy of a relatively inaccurate data receiver master clock in order to reduce the acquisition time of a desired information signal. The receiver master clock is first calibrated using an accurate timing relationship inherent in a received signal. The detected timing relationship is more accurate than the accuracy of the master clock itself. After calibration, a timing component of the desired information signal is acquired and used to run the master clock in a conventional manner. Any sufficiently accurate timing relationship in the received signal or in a separately transmitted reference signal can be used to calibrate the master clock.

Although the invention has been described in connection with various specific embodiments, those skilled in the art will appreciate that numerous adaptations and modifications may be made thereto without departing from the spirit and scope of the invention as set forth in the claims.

We claim:

1. A method for reducing the acquisition time of an embedded timing component in an information portion of a received signal by improving the apparent accuracy of a master clock in a data receiver clock circuit used to recover said embedded timing component, comprising the steps of:

detecting a timing relationship inherent in said received signal prior to the acquisition of said embedded timing component, said timing relationship having an accuracy that is greater than the accuracy of said master clock;

controlling said master clock in response to said timing relationship to operate with an improved range of accuracy;

acquiring said embedded timing component after said clock circuit is operating with said improved range of accuracy; and controlling said master clock in response to said embedded timing component instead of in response to said timing relationship after said embedded timing component has been acquired.

2. A method in accordance with claim 1 wherein said timing relationship is derived from a symbol rate of said received signal.

3. A method in accordance with claim 2 wherein said timing relationship and said timing component are asynchronous.

4. A method in accordance with claim 3 wherein said timing component is embedded in data packets for a desired service carried within said received signal.

5. A method in accordance with claim 2 wherein:

said symbol rate is defined by a stream of received symbols; and said master clock is controlled in response to said timing relationship by comparing a phase of said stream of received symbols to a phase of a clock signal produced by said clock circuit.

6. A method in accordance with claim 2 wherein said symbol rate is defined by a stream of received symbols, said method comprising the further steps of:

establishing a time interval by counting a set of said received symbols; and determining a total number of pulses generated by said clock circuit over said time interval;

wherein said master clock is controlled in response to said timing relationship by comparing said total number of pulses to a reference value to provide a clock circuit control signal.

7. A method in accordance with claim 1 wherein said timing relationship is derived from a symbol rate of said received signal.

8. A method in accordance with claim 7 wherein:

said symbol rate is defined by a stream of received symbols; and said master clock is controlled in response to said timing relationship by comparing a phase of said stream of received symbols to a phase of a clock signal produced by said clock circuit.

9. A method in accordance with claim 7 wherein said symbol rate is defined by a stream of received symbols, said method comprising the further steps of:

establishing a time interval by counting a set of said received symbols; and determining a total number of pulses generated by said clock circuit over said time interval;

wherein said master clock is controlled in response to said timing relationship by comparing said total number of pulses to a reference value to provide a clock circuit control signal.

10. A method in accordance with claim 1 wherein said timing relationship and said timing component are asynchronous.

11. A method in accordance with claim 1 wherein said timing component is embedded in data packets for a desired service carried within said received signal.

12. Apparatus for reducing the acquisition time of an embedded timing component in an information portion of a received signal by improving the apparent accuracy of a master clock in a data receiver clock circuit used to recover said embedded timing component, comprising:

means for detecting a timing relationship inherent in said received signal prior to the acquisition of said embedded timing component, said timing relationship having an accuracy that is greater than the accuracy of said master clock;

first means for controlling said master clock in response to said timing relationship to operate within an improved range of accuracy;

means for acquiring said embedded timing component after said clock circuit is operating with said improved range of accuracy; and second means for controlling said master clock in response to said embedded timing component instead of in response to said timing relationship after said embedded timing component has been acquired.

13. Apparatus in accordance with claim 12 wherein said timing relationship is derived from a symbol rate of said received information signal.

14. Apparatus in accordance with claim 13 wherein:

said symbol rate is defined by a stream of received symbols; and said first means for controlling said master clock compare a phase of said stream of received symbols to a phase of a clock signal produced by said clock circuit.

15. Apparatus in accordance with claim 13 wherein said symbol rate is defined by a stream of received symbols, said apparatus further comprising:

means for establishing a time interval by counting a set of said received symbols; and means for determining a total number of pulses generated by said clock circuit over said time interval;

wherein said first means for controlling said master clock compare said total number of pulses to a reference value to provide a clock circuit control signal.

16. Apparatus in accordance with claim 12 wherein said timing component is embedded in data packets for a desired service carried within said received signal.

17. Apparatus in accordance with claim 12 wherein said timing relationship is derived from a symbol rate of said received signal.

18. Apparatus in accordance with claim 17 wherein:

said symbol rate is defined by a stream of received symbols; and said first clock circuit means compare a phase of said stream of received symbols to a phase of a clock signal produced by said master clock.

19. Apparatus in accordance with claim 17 wherein said symbol rate is defined by a stream of received symbols, said apparatus further comprising:

means for establishing a time interval by counting a set of said received symbols; and means for determining a total number of pulses generated by said master clock over said time interval;

wherein said first means for controlling said master clock compare said total number of pulses to a reference value to provide a clock circuit control signal.

20. Apparatus for reducing the acquisition time of an embedded timing component in an information portion of a first received signal by improving the apparent accuracy of a master clock in a data receiver clock circuit used to recover said embedded timing component, comprising:

means for detecting a timing relationship in a second received signal prior to the acquisition of said embedded timing component, said timing relationship having an accuracy that is greater than the accuracy of said master clock;

first means for controlling said master clock in response to said timing relationship to operate within an improved range of accuracy;

means for acquiring said embedded timing component after said clock circuit is operating with said improved range of accuracy; and second means for controlling said master clock in response to said embedded timing component instead of in response to said timing relationship after said embedded timing component has been acquired.

21. Apparatus in accordance with claim 20 wherein said timing relationship is an inherent timing relationship of a transmitted television signal.

* * * * *